United States Patent
Zhang et al.

(10) Patent No.: US 10,942,129 B2
(45) Date of Patent: Mar. 9, 2021

(54) CHIP DEFECT DETECTION DEVICE AND DETECTION METHOD

(71) Applicant: SHANGHAI MICRO ELECTRONICS EQUIPMENT (GROUP) CO., LTD., Shanghai (CN)

(72) Inventors: Pengli Zhang, Shanghai (CN); Hailiang Lu, Shanghai (CN); Fan Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 39 days.

(21) Appl. No.: 16/343,913

(22) PCT Filed: Oct. 20, 2017

(86) PCT No.: PCT/CN2017/107115
§ 371 (c)(1),
(2) Date: Apr. 22, 2019

(87) PCT Pub. No.: WO2018/072749
PCT Pub. Date: Apr. 26, 2018

(65) Prior Publication Data
US 2020/0173932 A1    Jun. 4, 2020

(30) Foreign Application Priority Data
Oct. 20, 2016 (CN) .......................... 201610916613.9

(51) Int. Cl.
*G01N 21/88* (2006.01)
*G01B 9/02* (2006.01)
(Continued)

(52) U.S. Cl.
CPC ............ *G01N 21/8806* (2013.01); *G01B 9/02* (2013.01); *G01N 21/9501* (2013.01); *H01L 22/12* (2013.01); *G01B 2210/48* (2013.01)

(58) Field of Classification Search
CPC ......................... G01B 9/02032; G01B 9/02098
See application file for complete search history.

(56) References Cited

U.S. PATENT DOCUMENTS

| | | | | |
|---|---|---|---|---|
| 4,744,659 A | * | 5/1988 | Kitabayashi | G01J 9/02 356/494 |
| 6,744,517 B1 | * | 6/2004 | Forno | G01B 11/161 356/450 |

(Continued)

FOREIGN PATENT DOCUMENTS

| | | |
|---|---|---|
| CN | 201050978 Y | 4/2008 |
| CN | 101236067 A | 8/2008 |

(Continued)

OTHER PUBLICATIONS

Servin, M. et al., "Synthesis of multi-wavelength temporal phase-shifting algorithms optimized for high signal-to-noise ratio and high detuning robustness using the frequency transfer function", Optics Express, Apr. 25, 2016, vol. No. 24 Issue No. 9, 15 pages.

(Continued)

*Primary Examiner* — Shawn Decenzo
(74) *Attorney, Agent, or Firm* — Muncy, Geissler, Olds & Lowe, P.C.

(57) ABSTRACT

An apparatus and method for die defect detection are disclosed. The apparatus includes: a light source unit (10) for emitting light of at least two wavelengths; a beam splitter (40) for receiving the light emitted by the light source unit (10) and splitting it into a first portion and a second portion, the first portion of the light reflected by a die (60) surface under inspection and thereby forming a detection beam; a reference unit (70) for receiving the second portion of the (Continued)

light and processing it into a reference beam; and a detection unit (90) for receiving the detection beam and the reference beam. The reference beam crosses the detection beam at an angle and thus produces interference fringes on a sensing surface of the detection unit (90), based on which a defect parameter of the die (60) surface under inspection is determined. This apparatus is capable of measuring a die with improved accuracy and efficiency and is suitable for the measurement of large dies.

10 Claims, 5 Drawing Sheets

(51) Int. Cl.
*G01N 21/95* (2006.01)
*H01L 21/66* (2006.01)

(56) References Cited

U.S. PATENT DOCUMENTS

| | | | | |
|---|---|---|---|---|
| 2012/0120485 | A1* | 5/2012 | Ootomo | G02B 21/0016 359/370 |
| 2013/0057935 | A1* | 3/2013 | Joo | G01B 9/02032 359/10 |
| 2016/0245758 | A1 | 8/2016 | Liu et al. | |
| 2017/0122721 | A1* | 5/2017 | Huang | G01B 9/02027 |
| 2018/0235461 | A1* | 8/2018 | Koch | G01B 9/02082 |

FOREIGN PATENT DOCUMENTS

| | | |
|---|---|---|
| CN | 101324422 A | 12/2008 |
| CN | 101477325 A | 7/2009 |
| CN | 102538866 A | 7/2012 |
| CN | 103615993 A | 3/2014 |
| CN | 104006763 A | 8/2014 |
| CN | 104297260 A | 1/2015 |
| CN | 104534979 A | 4/2015 |
| CN | 105159044 A | 12/2015 |
| CN | 105842257 A | 8/2016 |
| JP | 2007093288 A | 4/2007 |
| JP | 2008209404 A | 9/2008 |
| JP | 2010014426 A | 1/2010 |
| JP | 2011040548 A | 2/2011 |
| TW | 201305528 A | 2/2013 |
| WO | WO2012132811 A1 | 10/2012 |
| WO | WO2015155779 A1 | 10/2015 |

OTHER PUBLICATIONS

Onodera, R. et al., "Two-Wavelength Interferometry that Uses a Fourier-Transform Method", Applied Optics, 37(34), Dec. 1, 1998, pp. 7988-7994.

* cited by examiner

CHIP DEFECT DETECTION DEVICE AND DETECTION METHOD

TECHNICAL FIELD

The present invention relates to the technical field of integrated circuit (IC) fabrication and, in particular, to an apparatus and method for die defect detection.

BACKGROUND

Super Moore's law and other concepts have led the transformation of the integrated circuit (IC) industry from an era where higher process nodes are pursued to a brand new era where chip packaging techniques are relied on. Wafer Level Packaging (WLP) is notably advantageous over traditional packaging in package size miniaturization and process cost reduction. Therefore, WLP is considered as one of the critical technologies that support the continuous development of the IC industry.

WLP includes majorly a number of processes such as Pillar/Gold/Solder Bump, RDL (Redistribution Layer) and TSV (Through Silicon Via). In order to achieve a higher yield of chip fabrication, defect inspection of the chip needs to be performed throughout the whole packaging process. Earlier apparatus for this purpose focused on the detection of two-dimensional (2D) surface defects like contaminants, scratches and particles. With higher requirements being imposed on process control, there is an increasing demand for inspection of three-dimensional (3D) surface characteristics such as bump height, RDL thickness and TSV depth. Conventional 3D die measurements can hardly meet the requirements of whole wafer scanning inspection due to low accuracy and efficiency levels.

SUMMARY OF THE INVENTION

It is an object of the present invention to present an apparatus and method for die defect detection so as to address the low-accuracy and low-efficiency issues with conventional apparatuses.

To solve the above technical problem, in one aspect of the present invention, there is provided an apparatus for die defect detection, comprising: a light source unit for emitting light of at least two wavelengths; a beam splitter for splitting the light emitted by the light source unit into a first portion and a second portion, the first portion reflected by a die surface under inspection and thereby forming a detection beam; a reference unit having a surface configured to receive the second portion of the light and thereby form a reference beam; and a detection unit for receiving the detection beam and the reference beam, wherein the reference beam crosses the detection beam at an angle and thus forming interference signals on a sensing surface of the detection unit, and wherein a defect parameter of the die surface under inspection is determined based on the interference signals.

Optionally, the detection unit may comprise at least one detector for detecting the interference signals.

Optionally, the detection unit may comprise a plurality of detectors, each configured for the detection of light with a corresponding one of the wavelengths.

Optionally, the detector may be implemented as a complementary metal oxide semiconductor or charge-coupled device image sensor.

Optionally, the reference unit may comprise a reflective element having a surface for receiving the second portion of the light and forming the reference beam, wherein the surface of the reflective element is inclined at an angle with respect to a vertical direction perpendicular to the die surface under inspection.

Optionally, the light emitted by the light source unit may have two wavelengths, wherein intensities, detected by the detection unit, of light with a shorter wavelength and of light with a synthetic wavelength generated from the two wavelengths respectively satisfy:

$$I_1 \approx \cos\left(\frac{2\pi}{\lambda_1} \cdot 2(z + x \cdot \sin\theta)\right);$$

$$I_2 \approx \cos\left[\left(\frac{2\pi}{\lambda_1} - \frac{2\pi}{\lambda_2}\right) \cdot 2(z + x \cdot \sin\theta)\right] = \cos\left[2\pi \frac{\lambda_2 - \lambda_1}{\lambda_1 \lambda_2} \cdot 2(z + x \cdot \sin\theta)\right],$$

where: $I_1$ represents the intensity of light with the shorter wavelength $\lambda_1$; $I_2$ represents the intensity of the light with the synthetic wavelength generated from the two wavelengths $\lambda_1$ and $\lambda_2$; $\theta$ represents an angle at which the surface of the reference unit is inclined with respect to a vertical direction perpendicular to the die surface under inspection; z represents a height of a measurement point on the die surface under inspection; and x represent a horizontal position of a sensing pixel in the detection unit.

Optionally, the light with the shorter wavelength $\lambda_1$ may determine a resolution of the apparatus for die defect detection, with the light with the synthetic wavelength generated from the two wavelengths determining a vertical measurement range of the apparatus for die defect detection, wherein the resolution and the vertical measurement range of the apparatus for die defect detection are given by the following equations:

$$R_0 = \lambda_1/2/SNR;$$

$$Z_0 = \lambda_S/2,$$

where: $R_0$ represents the resolution of the apparatus for die defect detection; SNR represents a signal-to-noise ratio of the apparatus for die defect detection; $Z_0$ represents the vertical measurement range of the apparatus for die defect detection; and $\lambda_S$ represents the synthetic wavelength generated from the two wavelengths $\lambda_1$ and $\lambda_2$.

Optionally, the light emitted by the light source unit may have three wavelengths, denoted respectively as $\lambda_1$, $\lambda_2$ and $\lambda_3$, wherein the detection unit comprises a number of superpixels, each of the superpixels comprising a plurality of pixels, each of the pixels configured to measure the intensity given by:

$$I(x, y) = A_1^2 + B_1^2 + 2A_1B_1\cos(\theta_{x,y,1} + \varphi_1) + A_2^2 + B_2^2 + 2A_2B_2\cos(\theta_{x,y,2} + \varphi_2) + A_3^2 + B_3^2 + 2A_3B_3\cos(\theta_{x,y,3} + \varphi_3);$$

where: (x, y) represents a coordinate of the pixel; $B_1$, $B_2$ and $B_3$ represent coefficients of the wavelengths $\lambda_1$, $\lambda_2$ and $\lambda_3$ of the light in relation to their transmission and reflection thereof; $A_1$, $A_2$ and $A_3$ represent coefficients of the wavelengths $\lambda_1$, $\lambda_2$ and $\lambda_3$ of the light in relation to reflectance of the die surface under inspection; $\varphi_1$, $\varphi_2$ and $\varphi_3$ represent initial phases of the wavelengths $\lambda_1$, $\lambda_2$ and $\lambda_3$ of the light; I(x, y) represents the intensity detected by the pixel at the coordinate (x, y); and $\theta_{x,y,i}$ represents an angle between light with the wavelength $\lambda_i$ of the light reflected back from the reference unit and light with the wavelength $\lambda_i$ of the light reflected back from the die surface under inspection, measured by the pixel at the coordinate (x, y), where i=1, 2, 3.

Optionally, the defect parameter of the die surface under inspection may be determined by an FFT algorithm.

Optionally, the apparatus may further comprise an objective lens for magnifying the die surface under inspection, wherein the objective lens is disposed between the beam splitter and the die surface under inspection.

In another aspect of the present invention, there is provided a method for die defect detection using the apparatus for die defect detection as defined above. The method comprises:

emitting a light of at least two wavelengths by a light source unit;

splitting, by a beam splitter, the light produced by the light source unit into a first portion and a second portion, the first portion reflected by a die surface under inspection and thereby forming a detection beam, the second portion forming a reference beam through a reference unit; and detecting, by the detection unit, interference signals generated by the detection beam and the reference beam, and determining a detect parameter of the die surface under inspection.

The apparatus and method for die defect detection of the present invention is capable of 3D measurement of a die with improved accuracy and efficiency by analyzing interference fringes formed by light of different wavelengths and is suitable for the detection of large dies.

In these figures: 10, a light source unit; 12, a fiber optic cable; 20, 71, 72 and 73, mirrors; 11, 31, 32 and 33, lenses; 40, 721, 731, 921 and 931, beam splitters; 41, a reference beam; 42, a detection beam; 50, an objective lens; 60, a die; 70, a reference unit; 90, a detection unit; and 91, 92 and 93, detectors.

DETAILED DESCRIPTION

The core idea of the present invention is to scan a planar surface of an object under inspection with light beams of different wavelengths and form interference fringes on a detector by using reference optical paths. A phase analysis on interference fringes as interference signals enables 3D measurement of the surface under inspection.

Particular embodiments of the present invention will be described in greater detail below with reference to the accompanying drawings. Features and advantages of the invention will be more apparent from the following detailed description, and from the appended claims. Note that the figures are much simplified and may not be drawn to scale, and their sole purpose is to facilitate easy and clear explanation of the embodiments.

Embodiment 1

Figure 1:
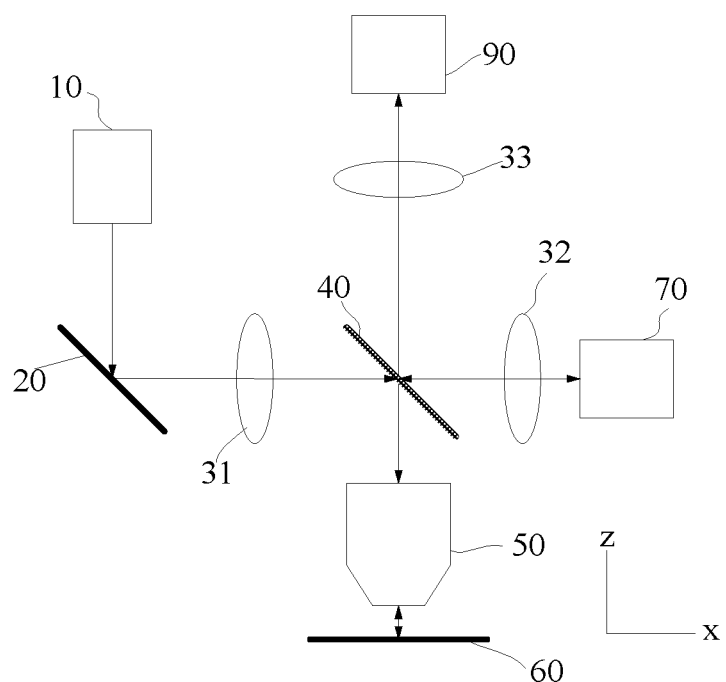
FIG. 1 schematically illustrates how an apparatus for die defect detection according to Embodiment 1 of the present invention works.

Reference is now made to FIG. 1, a schematic illustration of how an apparatus for die defect detection according to Embodiment 1 functions.

The apparatus for die defect detection essentially includes a light source unit 10, a reference unit 70, an objective lens 50, a detection unit 90, a beam splitter 40, a mirror 20 and a number of lenses.

The light source unit 10 is configured to produce light of certain wavelengths, which is then reflected by the mirror 20 onto a lens 31 and passes through the lens 31 to reach the beam splitter 40. The beam splitter 40 splits the light beam into two portions. A first portion is guided by the objective lens 50 onto a surface of a die 60 under inspection and reflected by the surface of the die 60. The reflection then propagates, as a detection beam 42, successively through the objective lens 50, the beam splitter 40 and a lens 33 and arrives at the detection unit 90. A second portion enters the reference unit 70 and reflected back therefrom to form a reference beam 41 which then successively passes through a lens 32, the beam splitter 40 and the lens 33 and also arrives at the detection unit 90. The detection and reference beams 42, 41 cross each other at an angle θ and thus form interference fringes on the detection unit 90. A phase analysis may be then performed on the interference fringes to infer a height of the surface under inspection.

The light emitted from the light source unit 10 has at least two wavelengths and is preferred to have good coherence and directivity. The wavelengths of the light may be chosen according to the desired height measurement range and resolution.

For the sake of convenient explanation, examples are given below with the light from the light source unit 10 respectively having two and three different wavelengths.

Figure 2:
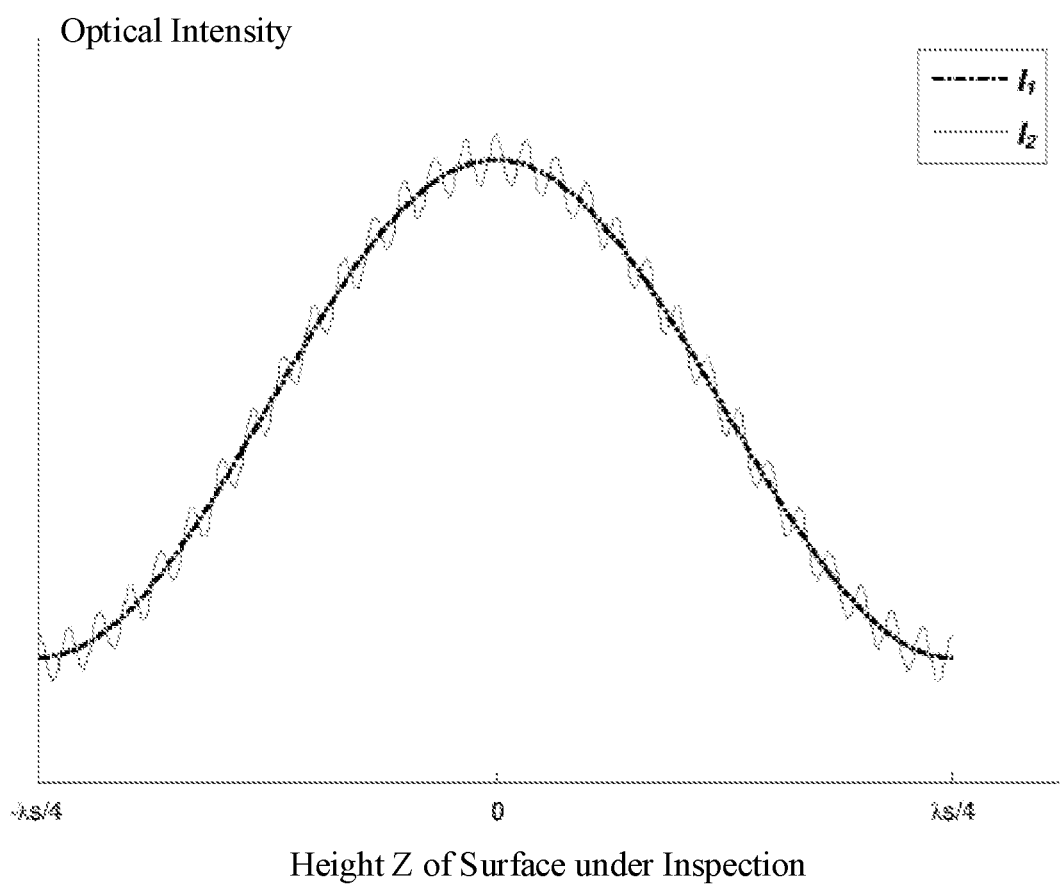
FIG. 2 shows interference signals resulting from light of two wavelengths emanated from a light source in the apparatus according to Embodiment 1 of the present invention.

In case of the light unit 10 using two wavelengths, denoted respectively as $\lambda_1$ and $\lambda_2$ ($\lambda_2 > \lambda_1$), the following two functions may be solved:

$$I_1 \approx \cos\left(\frac{2\pi}{\lambda_1} \cdot 2(z + x \cdot \sin\theta)\right) \quad (1a)$$

$$I_2 \approx \cos\left[\left(\frac{2\pi}{\lambda_1} - \frac{2\pi}{\lambda_2}\right) \cdot 2(z + x \cdot \sin\theta)\right] = \cos\left[2\pi \frac{\lambda_2 - \lambda_1}{\lambda_1 \lambda_2} \cdot 2(z + x \cdot \sin\theta)\right] \quad (1b)$$

where, z represents a vertical position (or height) of a measurement point on the surface under inspection, x represents a horizontal position of a pixel on a sensing surface. Eqn. (1a) describes an interference signal corresponding to the wavelength $\lambda_1$. That is, $I_1$ represents the intensity of light with a shorter-wavelength ($\lambda_1$) measured by the detection unit. Eqn. (1b) describes an interference signal corresponding to a synthetic wavelength $$\lambda_s = \frac{\lambda_1 \lambda_2}{\lambda_2 - \lambda_1}$$

generated from the two wavelengths $\lambda_1$ and $\lambda_2$. That is, $I_2$ represents the intensity of light of a synthetic-wavelength measured by the detection unit. As shown in FIG. 2, the profile of $I_1$ represents global variation of the height of the surface under inspection in the Z-direction (e.g., in the wide range of $-\lambda_S/4$ to $\lambda_S/4$ as shown), while the profile of $I_2$ represents local vibrations in the Z-direction ($\Delta z$ in small ranges). Thus, the wavelength $\lambda_1$ determines the resolution of the system, i.e., $R_0=\lambda_1/2/SNR$ (where, SNR represents the signal to noise ratio of the system), and the synthetic wavelength $\lambda_S$ determines the vertical measurement range of the system, i.e., $Z_0=\lambda_S/2$.

In case of the light unit 10 using three wavelengths, denoted respectively as $\lambda_1$, $\lambda_2$ and $\lambda_3$ ($\lambda_3>\lambda_2>\lambda_1$), interference signals resulting from components of these three wavelengths can be represented by following $I_1$, $I_2$ and $I_3$:

$$I_1 \approx \cos\left(\frac{2\pi}{\lambda_1} \cdot 2(z + x \cdot \sin\theta)\right) \quad (2a)$$

$$I_2 \approx \cos\left[\left(\frac{2\pi}{\lambda_1} - \frac{2\pi}{\lambda_3}\right) \cdot 2(z + x \cdot \sin\theta)\right] = \cos\left[2\pi \frac{\lambda_3 - \lambda_1}{\lambda_1 \lambda_3} \cdot 2(z + x \cdot \sin\theta)\right] \quad (2b)$$

$$I_3 \approx \cos\left[2\pi\left(\frac{1}{\lambda_1} + \frac{1}{\lambda_3} - \frac{2}{\lambda_2}\right) \cdot 2(z + x \cdot \sin\theta)\right] = \cos\left[2\pi \frac{\lambda_2 \lambda_3 + \lambda_1 \lambda_2 - 2\lambda_1 \lambda_3}{\lambda_1 \lambda_2 \lambda_3} \cdot 2(z + x \cdot \sin\theta)\right] \quad (2c)$$

In the system employing the three wavelengths, $\lambda_1$ determines the resolution of the system, i.e., $R_0=\lambda_1/2/SNR$ (where, SNR represents its signal to noise ratio), the synthetic wavelength $$\lambda_s = \frac{\lambda_1 \lambda_2 \lambda_3}{\lambda_2 \lambda_3 + \lambda_1 \lambda_2 - 2\lambda_1 \lambda_3}$$

determines the vertical measurement range of the system, i.e., $Z_0=\lambda_S/2$.

Based on relevant knowledge in the art, the detection system may be extended to a larger number of wavelengths.

Figure 3:
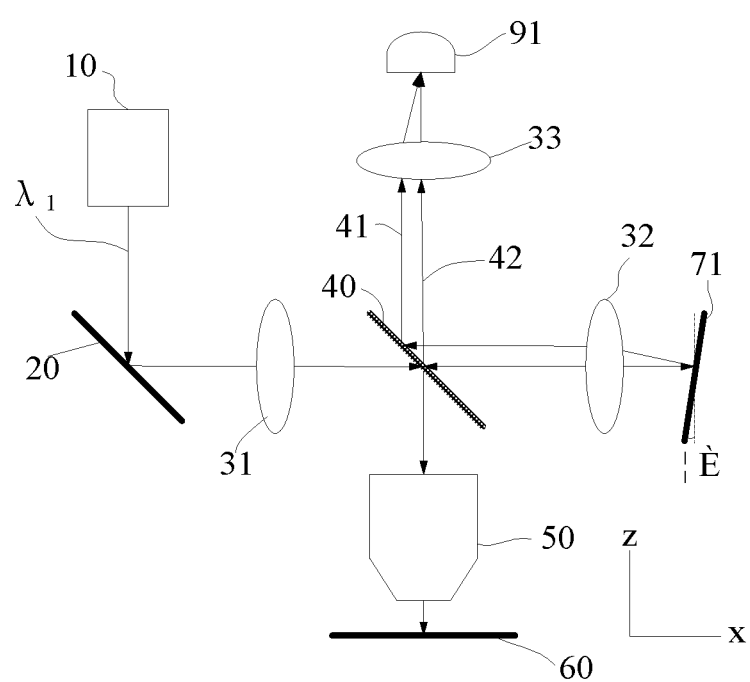
FIG. 3 is a diagram schematically showing an optical path of light emanated from the light source in the apparatus according to Embodiment 1 of the present invention, which is of a single wavelength.

Reference is now made to FIG. 3, a diagram showing an interferometric optical path in a scenario where the light is of a single wavelength $\lambda$. In this case, the detection unit 90 includes one detector 91, and the reference unit 70 includes one mirror 71. As shown in the figure, the die 60 is placed with its surface under inspection being horizontal, and the mirror 71 is inclined at an angle $\theta$ with respect to the vertical direction so that interference fringes are formed on the detector 91. The detector 91 may be a photoelectric detector (e.g., a complementary metal oxide semiconductor (CMOS) or charge-coupled device (CCD) image sensor). Interference signals derived from the interference fringes formed by the detection and reference beams 42, 41 on the detector 91 can be expressed as Eqn. (3). In order to solve a vertical height z of a single measurement point on the surface under inspection, a series of superpixels are provided on the detector, each consisting of m×n pixels (i.e., m rows and n columns of pixels, e.g., 5×5 pixels) in correspondence with an optical resolution of the objective lens 50.

$$I(x, y) = A_1^2 + B_1^2 + 2A_1B_1\cos(\theta_{x,y,1} + \varphi_1) + A_2^2 + B_2^2 + \quad (3)$$
$$2A_2B_2\cos(\theta_{x,y,2} + \varphi_2) + A_3^2 + B_3^2 + 2A_3B_3\cos(\theta_{x,y,3} + \varphi_3)$$

where: x=1, 2, . . . , m; y=1, 2, . . . , n; I(x, y) represents the optical intensity incident on the pixel at the x-th row and the y-th column in one of the superpixel; $B_1$, $B_2$ and $B_3$ represent coefficients of the wavelengths $\lambda_1$, $\lambda_2$ and $\lambda_3$ of the light in relation to their transmission and reflection in the reference optical path, the coefficients determinable by calibration; $A_1$, $A_2$ and $A_3$ represent coefficients of the wavelengths $\lambda_1$, $\lambda_2$ and $\lambda_3$ of the light in relation to reflectance of the surface under inspection; $\theta_{x,y,1}$, $\theta_{x,y,2}$ and $\theta_{x,y,3}$ represent phase changes of the wavelengths $\lambda_1$, $\lambda_2$ and $\lambda_3$ of the light at the sensing surface, respectively, wherein the "x,y" parts in their subscript indices correspond to the coordinate of the pixel on the sensing surface, and the "1", "2" and "3" parts correspond to the wavelengths $\lambda_1$, $\lambda_2$ and $\lambda_3$, respectively, and wherein $\theta$'s in Eqn. (3) are not necessarily related to the angle $\theta$ at which the mirror 71 is inclined with respect to the vertical direction; and $\varphi_1$, $\varphi_2$ and $\varphi_3$ represent phases of the wavelengths $\lambda_1$, $\lambda_2$ and $\lambda_3$ induced by the vertical position z of the surface under inspection, respectively. For each of the m×n superpixels, m×n equations can be obtained. For each measurement point, $\varphi_1+\varphi_3-2\varphi_2$, $\varphi_2-\varphi_1$ and $\varphi_1$ can be sequentially solved using a phase retrieval algorithm such as FFT, and the height z can be calculated according to:

$$z = \frac{\varphi_1}{4\pi} \cdot \lambda_1 \quad (4)$$

Figure 4:
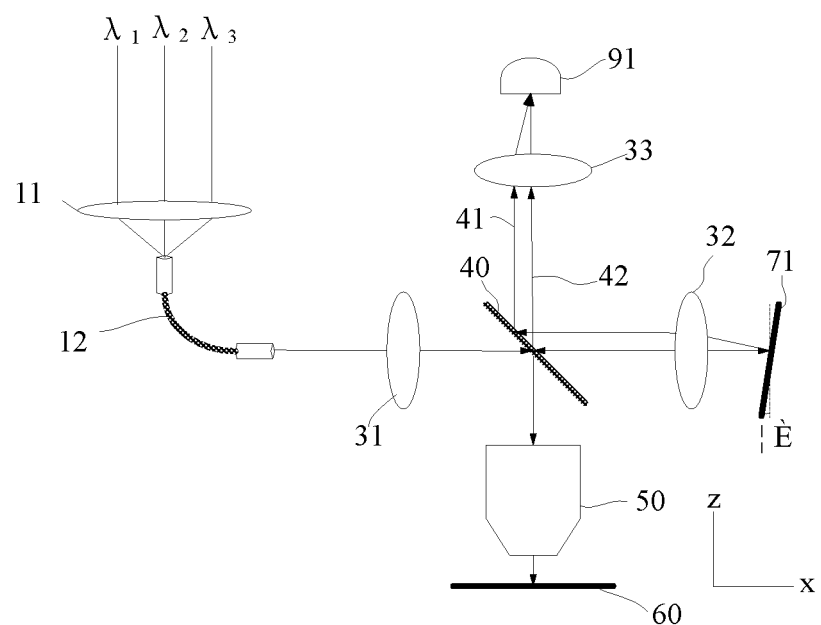
FIG. 4 is a diagram schematically showing an optical path of light emanated from the light source in the apparatus according to Embodiment 1 of the present invention, which is of three wavelengths.

Referring to FIG. 4, in a scenario where the three wavelengths are $\lambda_1$=560 nm, $\lambda_2$=630 nm and $\lambda$=719.5 nm, respectively. Assuming the signal-to-noise ratio of the system is SNR=20, the vertical measurement resolution of the system can be obtained as $R_0$=560/SNR=28 nm and vertical measurement range of the system as $Z_0$=518 μm. In this case, the light of the three wavelengths is coupled by a lens 11 to a fiber optic cable 12 and propagates therein down to the lens 31. Here, the fiber optic cable 12 serves in lieu of the mirror 20. In this Embodiment, interference signals derived from the light of three wavelengths are detected using the single mirror 71 in the reference unit 70 and the single CCD or CMOS image sensor in the detector 91. When different measurement points on the surface under inspection have different heights z, the superpixels will capture different interference signals and the heights z can be obtained from a phase analysis on phases of the signals.

Embodiment 2

Figure 5:
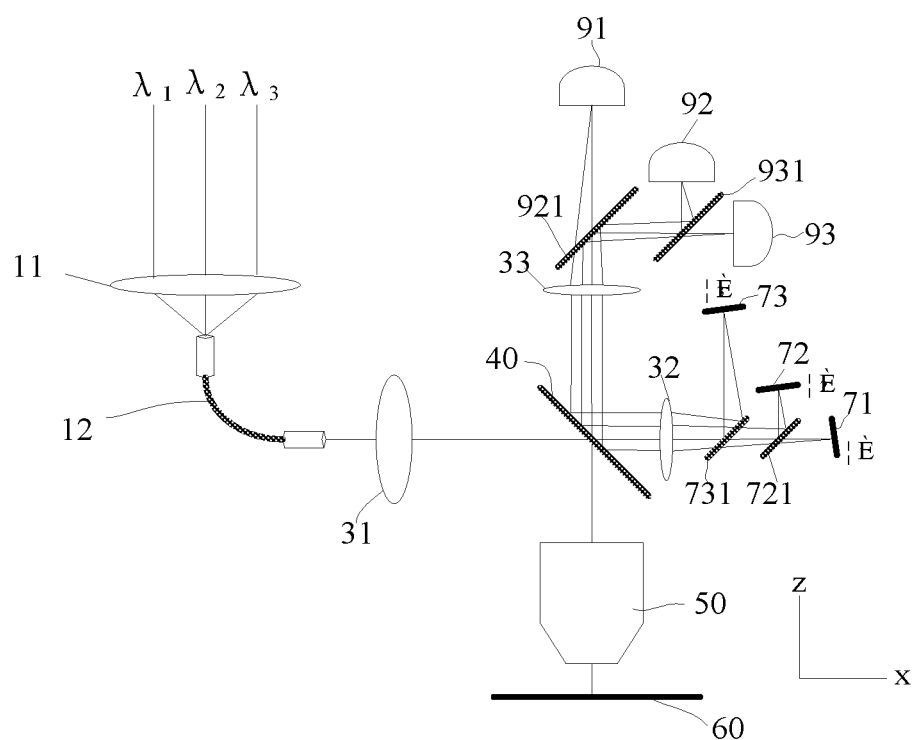
FIG. 5 schematically illustrates how an apparatus for die defect detection according to Embodiment 2 of the present invention works.

Reference is now made to FIG. 5, a schematic illustrating how an apparatus for die defect detection according to Embodiment 2 works. The apparatus for die defect detection of Embodiment 2 differs from that of Embodiment 1 in that interference signals derived from $\lambda_1$, $\lambda_2$ and $\lambda_3$ are detected by respective three mirrors 71, 72, 73 in the reference unit 70 and respective three detectors 91, 92, 93 in the detection unit 90. The three mirrors in the reference unit are inclined at angles $\theta_1$, $\theta_2$ and $\theta_3$ with respect to directions perpendicular to directions of incidence of the respective reference beams, and $\theta_1$, $\theta_2$ and $\theta_3$ are individually set to different values so that periodicity distribution of the interference fringes can be adjusted. The three detectors in the detection unit 90 are provided to eliminate crosstalk between the interference signals derived from the three wavelengths and thus improve SNR performance of the system. In the figure, 731, 721, 921 and 931 each denotes a beam splitter. The beam splitter 731 is reflective to the wavelength $\lambda_1$ and transmissive to the wavelength $\lambda_2$ and $\lambda_3$. The beam splitter 721 is reflective to the wavelength $\lambda_2$ and transmissive to the wavelength $\lambda_3$. The beam splitter 921 is reflective to the wavelength $\lambda_2$ and $\lambda_3$ and transmissive to the wavelength $\lambda_1$. The beam splitter 931 is reflective to the wavelength $\lambda_2$ and transmissive to the wavelength $\lambda_3$.

With the apparatus for die defect detection of Embodiment 2, the above Eqns. (3) and (4) may also be used to calculate vertical positions of the surface under inspection in a similar manner to Embodiment 1. A higher SNR can be obtained in accordance with Embodiment 2 compared to Embodiment 1.

In summary, the apparatus for die defect detection of the present invention is capable of 3D measurement of a die with improved accuracy and efficiency by analyzing interference fringes formed by light of different wavelengths and is suitable for the detection of large dies.

The embodiments disclosed herein are described in a progressive manner, with the description of each embodiment focusing on its differences from the other embodiments. Reference can be made between the embodiments for a detail description of any feature common or essentially common to them. As the system keeps the same features as the method, a description of the system is relatively simplified, and reference can be made to the description of the method for details in the system.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. An apparatus for die defect detection, comprising:
    a light source unit for emitting light of two wavelengths;
    a beam splitter for splitting the light emitted by the light source unit into a first portion and a second portion, the first portion reflected by a die surface under inspection and thereby forming a detection beam;
    a reference unit having a surface configured to receive the second portion of the light and thereby form a reference beam; and
    a detection unit for receiving the detection beam and the reference beam, wherein the reference beam crosses the detection beam at an angle and thus forming interference signals on a sensing surface of the detection unit, and wherein a defect parameter of the die surface under inspection is determined based on the interference signals;

wherein intensities, detected by the detection unit, of light with a shorter wavelength and of light with a synthetic wavelength generated from the two wavelengths respectively satisfy:

$$I_1 \approx \cos\left(\frac{2\pi}{\lambda_1} \cdot 2(z + x \cdot \sin\theta)\right);$$

$$I_2 \approx \cos\left[\left(\frac{2\pi}{\lambda_1} - \frac{2\pi}{\lambda_2}\right) \cdot 2(z + x \cdot \sin\theta)\right] = \cos\left[2\pi \frac{\lambda_2 - \lambda_1}{\lambda_1 \lambda_2} \cdot 2(z + x \cdot \sin\theta)\right],$$

where: $I_1$ represents the intensity of the light with the shorter wavelength $\lambda_1$; $I_2$ represents the intensity of the light with the synthetic wavelength generated from the two wavelengths $\lambda_1$ and $\lambda_2$; $\theta$ represents an angle at which the surface of the reference unit is inclined with respect to a vertical direction perpendicular to the die surface under inspection; z represents a height of a measurement point on the die surface under inspection; and x represents a horizontal position of a sensing pixel in the detection unit.

2. The apparatus for die defect detection of claim 1, wherein the detection unit comprises at least one detector for detecting the interference signals.

3. The apparatus for die defect detection of claim 2, wherein the detection unit comprises a plurality of detectors, each configured for the detection of light with a corresponding one of the wavelengths.

4. The apparatus for die defect detection of claim 2, wherein the detector is implemented as a complementary metal oxide semiconductor or charge-coupled device image sensor.

5. The apparatus for die defect detection of claim 1, wherein the reference unit comprises a reflective element having a surface for receiving the second portion of the light and forming the reference beam, the surface of the reflective element inclined at an angle with respect to a vertical direction perpendicular to the die surface under inspection.

6. The apparatus for die defect detection of claim 1, wherein the light with the shorter wavelength $\lambda_1$ determines a resolution of the apparatus for die defect detection, with the light with the synthetic wavelength generated from the two wavelengths determining a vertical measurement range of the apparatus for die defect detection, the resolution and the vertical measurement range of the apparatus for die defect detection given by the following equations:

$$R_0 = \lambda_1/2/\text{SNR};$$

$$Z_0 = \lambda_S/2,$$

where: $R_0$ represents the resolution of the apparatus for die defect detection; SNR represents a signal-to-noise ratio of the apparatus for die defect detection; $Z_0$ represents the vertical measurement range of the apparatus for die defect detection; and $\lambda_S$ represents the synthetic wavelength generated from the two wavelengths $\lambda_1$ and $\lambda_2$.

7. The apparatus for die defect detection of claim 1, further comprising an objective lens for magnifying the die surface under inspection, the objective lens disposed between the beam splitter and the die surface under inspection.

8. A method for die defect detection using the apparatus for die defect detection as defined in claim 1, the method comprising:
- emitting light of two wavelengths by a light source unit;
- splitting, by a beam splitter, the light emitted by the light source unit into a first portion and a second portion, the first portion reflected by a die surface under inspection and thereby forming a detection beam, the second portion forming a reference beam through a reference unit; and
- detecting, by a detection unit, interference signals generated by the detection beam and the reference beam, and determining a defect parameter of the die surface under inspection.

9. An apparatus for die defect detection, comprising:
- a light source unit for emitting light of three wavelengths denoted respectively as $\lambda_1$, $\lambda_2$ and $\lambda_3$;
- a beam splitter for splitting the light emitted by the light source unit into a first portion and a second portion, the first portion reflected by a die surface under inspection and thereby forming a detection beam;
- a reference unit having a surface configured to receive the second portion of the light and thereby form a reference beam; and
- a detection unit for receiving the detection beam and the reference beam, wherein the reference beam crosses the detection beam at an angle and thus forming interference signals on a sensing surface of the detection unit, and wherein a defect parameter of the die surface under inspection is determined based on the interference signals;
- wherein the detection unit comprises a number of superpixels, each of the superpixels comprising a plurality of pixels, each of the pixels configured to measure an intensity given by:

$$I(x, y) = A_1^2 + B_1^2 + 2A_1B_1\cos(\theta_{x,y,1} + \varphi_1) + A_2^2 + B_2^2 + 2A_2B_2\cos(\theta_{x,y,2} + \varphi_2) + A_3^2 + B_3^2 + 2A_3B_3\cos(\theta_{x,y,3} + \varphi_3);$$

where: (x, y) represents a coordinate of the pixel; $B_1$, $B_2$ and $B_3$ represent coefficients of the wavelengths $\lambda_1$, $\lambda_2$ and $\lambda_3$ of the light in relation to transmission and reflection thereof; $A_1$, $A_2$ and $A_3$ represent coefficients of the wavelengths $\lambda_1$, $\lambda_2$ and $\lambda_3$ of the light in relation to reflectance of the die surface under inspection; $\varphi_1$, $\varphi_2$ and $\varphi_3$ represent initial phases of the wavelengths $\lambda_1$, $\lambda_2$ and $\lambda_3$ of the light; I(x, y) represents the intensity detected by the pixel at the coordinate (x, y); and $\theta_{x,y,i}$ represents an angle between light with the wavelength $\lambda_i$ reflected back from the reference unit and light with the wavelength $\lambda_i$ reflected back from the die surface under inspection, measured by the pixel at the coordinate (x, y), where i=1, 2, 3.

10. The apparatus for die defect detection of claim 9, wherein the defect parameter of the die surface under inspection is determined by an FFT algorithm.

* * * * *